United States Patent [19]

Knox et al.

[11] 4,229,688

[45] Oct. 21, 1980

[54] BATTERY DISCHARGE INDICATOR

[75] Inventors: Raymond L. Knox, Bluefield, Va.; Charles D. Lindsay, Mansfield, Ohio

[73] Assignee: A-T-O Inc., Willoughby, Ohio

[21] Appl. No.: 939,403

[22] Filed: Sep. 5, 1978

[51] Int. Cl.³ .................... H02J 7/00; H01M 10/48
[52] U.S. Cl. ................................. 320/48; 320/13; 323/21; 340/636
[58] Field of Search .................. 320/48, 39, 40, 13; 323/21; 340/636

[56] References Cited

U.S. PATENT DOCUMENTS

| 3,851,528 | 12/1974 | Nichols et al. | 320/48 X |
| 3,979,657 | 9/1976 | Yorksie | 320/48 X |

OTHER PUBLICATIONS

"Instruments and Control Systems", Dec., 1972, p. 48.

Primary Examiner—Robert J. Hickey
Attorney, Agent, or Firm—Webster B. Harpman

[57] ABSTRACT

A battery discharge indicator device for use on battery powered mining haulage vehicles is provided which automatically monitors the discharge condition of each of the battery supply sources provided on a mining haulage vehicle. The battery discharge indicator provides a continuously flashing lamp indication when any of the battery supply sources discharges to a predetermined level required to power the mining haulage vehicle to a charging station. A momentary flashing indication is further provided when the discharged battery source or sources are replaced with charged battery sources thereby indicating to the operator that the battery powered mining vehicle is ready for use.

18 Claims, 2 Drawing Figures

BATTERY DISCHARGE INDICATOR

BACKGROUND OF THE INVENTION

The present invention relates to the field of battery discharge indicator devices for use on battery powered mining haulage vehicles or the like such as tractors and scoop-tractors which utilize 96 or 128 volt battery supply systems. The battery supply sources for the beforementioned battery powered mining vehicles normally consist of two, 24 or 32 cell lead acid battery trays.

West Virginia Mine Law presently requires the use of a battery discharge indicator device on battery powered mining vehicles and further requires that mining vehicle operators cease all work and return the mining vehicle to a charging station when a battery discharge indicator device operates to indicate that the battery supply source or sources have discharged to a low level charge state.

It has been noted by applicants that miners have been known to defeat safety equipment if its use is deemed, by the miner, to be an inconvenience. This creates the need for a "non-tamperable" battery discharge indicator circuit device which can only be reset or returned to a non-alarm indicating state of operation by replacing a discharged battery supply source or battery tray with a charged source or battery tray.

BRIEF SUMMARY OF THE INVENTION

In accordance with the purpose of the present invention, a battery discharge indicator device is provided which automatically and separately interrogates or monitors the two battery supply sources normally provided on a battery powered mining haulage vehicle. The present device operates to provide a continuously flashing lamp indication when either one or both of the voltage outputs of the two battery supply sources reach a predetermined discharge level thereby indicating to an operator of a battery powered mining haulage vehicle that either one or both of the battery supply sources has discharged to a designated low level charge state and whereupon, in accordance with the present requirements of West Virginia Mine Law, an operator is alerted to cease all work and return the mining vehicle to a charging station so that the discharged battery supply source or sources can be replaced with "charged" battery supply source(s).

More specifically, a readily viewable, continuously flashing light indication warns an operator when the charge level of the battery supply source or sources reach a minimum level, or trip level, required to power a mining vehicle to a charging station, thus eliminating the possibility of the battery supply source or sources being discharged to such a level insufficient to power the mining vehicle to a charging station; and whereby the inconvenience of a disabled mining vehicle blocking a passageway and having to be towed to a charging station may be avoided.

Furthermore, the present device also operates as a battery charge condition indicator by providing a momentary flashing indication whenever "fully charged" battery supply sources are connected thereto to replace the "discharged" battery supply sources, thereby indicating to an operator of a battery or electrically powered mining vehicle that it is ready for use.

As mentioned above, the "trip-level" is that minimum charge level of the battery supply source or sources required to power a battery powered mining vehicle to a charging station. In that the distance between the location where a mining vehicle is being used and the location of a charging station may vary, the battery discharge indicator circuit device of the present invention may be preset and/or programmed to operate in accordance with a desired, predetermined "trip-level", thereby allowing the distance between the location where a mining vehicle is being used and the location of a charging station to be programmed into the indicator circuit of the present device.

The present invention also provides a "non-tamperable" battery discharge indicator circuit device which can only be reset or returned to a non-alarm indicating state of operation by replacing the "discharged" battery supply source or sources with a "charged" battery supply source or sources.

The present invention further provides means for electrically isolating each voltage sensor circuit which is achieved through the use of an optical link device comprising a photo-optical coupler, connected between each voltage sensor circuit and the remaining indicator circuitry, thus providing isolation between each voltage sensing circuit connected to each battery supply source or battery tray.

OBJECTS OF THE INVENTION

It is, therefore, an object of the present invention to provide a battery discharge indicator circuit device for use on battery powered mining vehicles or the like which automatically interrogates or monitors the discharge condition of the battery supply source or sources provided on a battery powered mining vehicle.

It is a specific object of the present invention to provide a battery discharge indicator circuit device for use on battery powered mining vehicles which automatically and separately interrogates or monitors the discharge condition of either one, or both, of the battery supply sources normally provided on a battery powered mining vehicle.

It is another object of the present invention to provide a battery discharge indicator circuit device for use on electrically powered mining vehicles which provides a continuously flashing indication whenever the charge level of the battery supply source or sources provided on a battery powered mining vehicle reach a predetermined minimum charge level, or "trip-level", required to power a battery powered mining vehicle to a charging station.

It is still another object of the present invention to provide a battery charge condition indicator circuit device for use on battery powered mining vehicles which provides a momentary flashing indication whenever "charged" battery supply sources are connected to the indicator circuit device to replace the "discharged" battery supply sources in order to indicate to an operator of a battery powered mining vehicle that the vehicle is now ready for use.

It is still yet another object of the present invention to provide a battery discharge indicator circuit device for battery powered mining vehicles which may be preset or adjusted to be programmed to operate in accordance with a desired predetermined "trip-level" (predetermined discharge level), thereby enabling the distance between the location where a battery powered mining vehicle is being used and the location of a charging station to be programmed into the indicator circuit of the present invention.

It is but yet another object of the present invention to provide a battery discharge indicator circuit device for use on battery powered mining vehicles which is "non-tamperable" and which can only be reset or returned to a non-alarm indicating state of operation by replacing the "discharged" battery supply source or sources with a "charged" battery supply source or sources.

It is but still yet another object of the present invention to provide electrical isolation between each voltage sensing circuit connected to each battery supply source or battery tray.

In accordance with these and other objects of the present invention which will be apparent hereinafter, the present device will now be described with particular reference to the accompanying drawings.

DETAILED DESCRIPTION OF THE INVENTION

Figure 1:
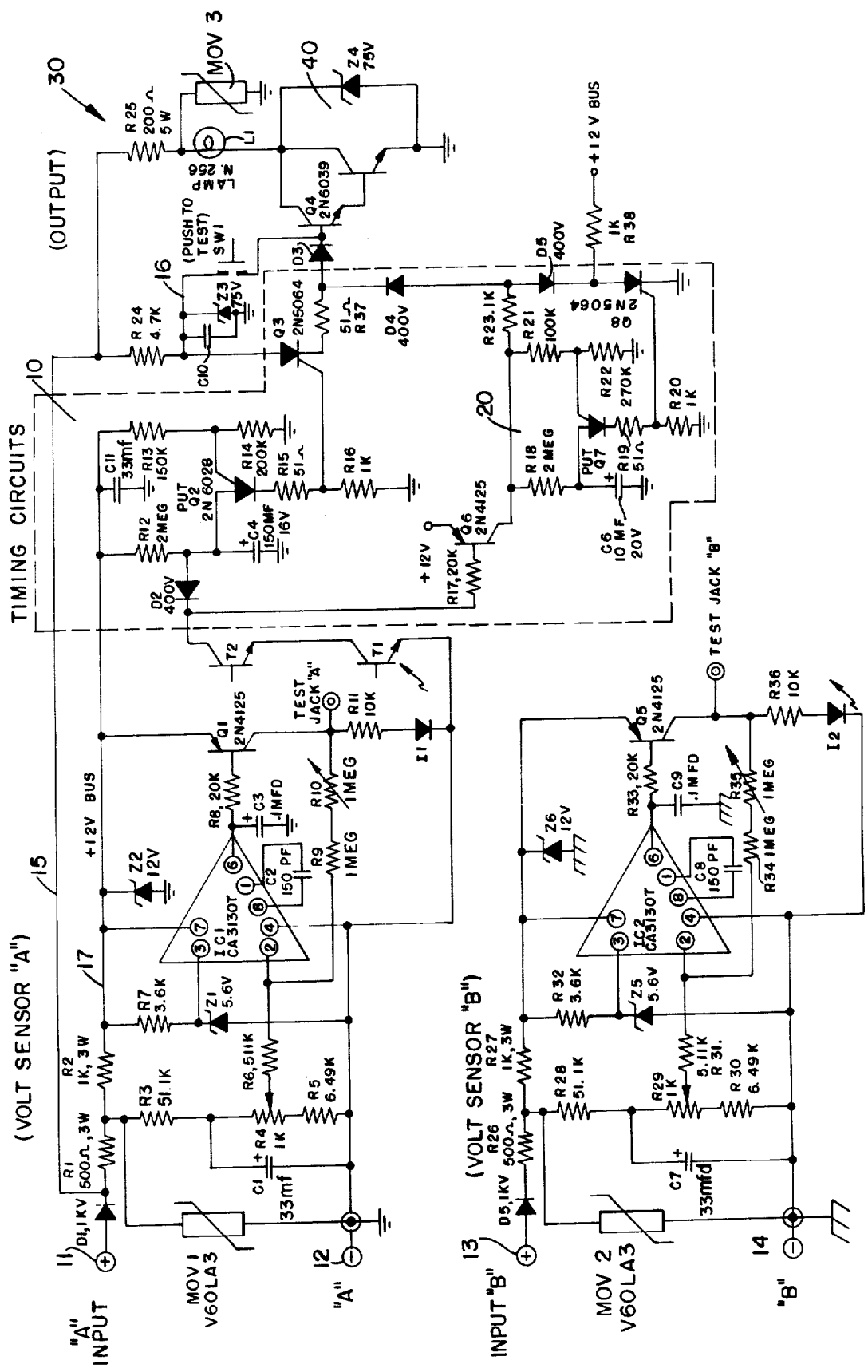
FIG. 1 shows a schematic circuit diagram of a preferred embodiment of the present invention.

As shown in FIG. 1, the battery discharge indicator circuit of the present invention comprises two voltage sensor circuits "A" and "B"; photo-optical coupling circuit means comprising light-emitting diodes (LED's) I1, I2 and phototransistors T1, T2; timing circuits 10 (5 minute timer) and 20 (30 second timer); and an alarm indicating output circuit means 30. The power needed to supply the present invention is derived from the respective battery supply sources connected to the present device, as shown in FIG. 1, i.e., through line 17 including resistors R1, R2 and line 15, etc.

As stated above, the purpose of the present invention is to provide a battery discharge indicator circuit device for use on battery powered mining vehicles which automatically and separately interrogates or monitors the discharge condition of each of the two battery supply sources, or battery trays, normally provided as the power source for a mining vehicle.

Referring to FIG. 1, each of the two battery supply sources, the discharge condition of which is to be indicated, is arranged for separate connection to positive and negative terminals 11, 12 and 13, 14 of voltage sensor circuits "A" and "B", respectively.

Voltage sensor circuits "A" and "B" comprise operational amplifiers IC1 and IC2 configured and used as voltage comparators with zener diodes Z1 and Z5, connected respectively to the regulated 12 volt bus line through resistors R7 and R32, which provide a 5.6 V reference input voltage to pin 3 of each voltage comparator IC1, IC2.

Since voltage sensor circuits "A" and "B" are essentially identical and thereby comprise corresponding components, only the circuit components and operation of voltage sensor circuit "A" will be discussed hereinafter, for the sake of brevity.

Diode D1 provides reverse polarity protection, preventing damage to the battery discharge circuit in the event that a battery is connected incorrectly thereto. Diode D1 is further provided to prevent damaging level negative transient voltages, generated in the motor circuit of an electrically powered mining vehicle, from being applied to the circuit of the present device.

Transient voltage protection is further provided for the potential divider network comprising R3, R4 and R5 via metal-oxide varistor MOV1 (a semi-conductor surge suppressor) which starts clipping transient voltages at a 64 volt level. A measure of time delay is also incorporated into the potential divider network through the use of capacitor C1 for preventing voltage transients or quick battery voltage excursions from reaching the input of voltage comparator IC1 and to ensure that the output of IC1 remains locked in its correct state of operation, if such transients or excursions should occur, thereby preventing incorrect circuit operations.

Zener diode Z2 operates to regulate the bus line voltage at line 17 to 12 volts which is applied, as shown in FIG. 1, at various points in the circuit.

Voltage comparator IC1 operates to compare an input voltage applied at pin 2 to a reference voltage applied at pin 3. The input voltage applied at pin 2 is the "scaled-down" battery supply source voltage developed via the potential divider network comprising resistors R3, R4 and R5, which voltage may be adjusted over a limited range via variable resistor R4. The adjustment of R4 allows for the setting of a predetermined charge level value or point at which a "fully charged" battery supply source must be in order to cause the present indicator circuit device to initiate a momentary flashing indication operation for a time period of, for example, 30 seconds, and to inhibit the operation of 5-minute timer device 10. This voltage is applied to pin 2 of IC1 through resistor R6.

Capacitor C2 connected between pins 1 and 8 of IC1 and capacitor C3 connected to output pin 6 of IC1 provide for stabilization of voltage comparator IC1.

A positive feedback circuit for IC1 is provided via fixed resistor R9 and variable resistor R10. The positive feedback signal is applied to pin 2 of IC1 and will be further discussed hereinafter.

The base of transistor Q1 is connected through fixed resistor R8 to output pin 6 of IC1. The emitter of Q1 is connected to the 12 V bus line and the collector of Q1 is connected to the junction of R10, R11 and test jack "A".

Light emitting diode I1, which may be of the infrared-emitting type, is connected at its anode to the collector of Q1 through resistor R11. The cathode of LED I1 is connected, as shown, in circuit to pin 4 of IC1, the bottom of R5 and C1 and to terminal 12.

Optical link devices are provided via optically coupled devices I1, T1 and I2, T2 thereby eliminating any electrical connection between the respective components, and thus achieving electrical isolation between each voltage sensor circuit.

Phototransistors T1 and T2, connected in series with each other, as shown in the Figure, essentially operate as an "AND gate" such that Q6 may only be activated, turned "on", when both phototransistors T1 and T2 are conducting. Both of these phototransistors must be activated by their respective LED's in order to inhibit the operation of 5-minute timer device 10.

Q6 is connected at its base, through resistor R17, to the collector of phototransistor T2. The emitter of Q6 connects to the 12 V bus line and the collector of Q6 is connected in cirlcuit to 30-second timer means 20.

As shown in FIG. 1, timer circuit device 20 comprises: resistors R18, R19, R20, R21, R22 and R23; capacitor C6; programmed unijunction transistor (PUT) device Q7; silicon controlled rectifier (SCR) device Q8; and diode D5. The 12 V bus voltage is applied to the junction of D5 and Q8 via resistor R38 which supplies latching current to Q8.

Timer circuit device 10 (5-minute timer), which is connected via diode D2 to the collector of phototransistor T2, comprises: resistors R12, R13, R14, R15, R16 and R37; capacitor C4; PUT device Q2; and SCR device Q3.

Capacitors C10, C11 and resistor R37, and zener diodes Z3, Z4 are provided in order to prevent damage to, or incorrect operation of, the present discharge indicator circuit when damaging transient voltages, generated in the motor circuit of a battery powered motor vehicle, occur.

R24 is connected in series between the anode of SCR device Q3 and circuit line 15 which connects the junction point of D1, R1 to the top of resistors R24 and R25.

Lamp driver transistor Q4 has its base drive supplied through R23, D4 and D3. Diode D3 is connected in series with R37 and the base of Q4. Diode D4 is connected in series between the 30-second timer circuit 20 at the junction of R23, D5 and the junction of R37, D3.

Capacitor C10 and zener diode Z3 are connected in parallel to circuit line 16 which connects the junction of R24, Q3 to the junction of D3, Q4 via a push-to-test switch SW1. C10 and Z3 are also connected in series between line 16 and ground.

Lamp driver circuit 40 comprises Darlington-connected transistor device Q4, zener diode Z4, resistor R25, and a self-flashing, 14 V miniature bayonet type lamp L1. L1 requires a 200 ohm dropping resistor R25, which is connected in series with L1 and circuit line 15, in order to limit the inrush current steady state voltage which is applied to L1.

A push-button switch means SW1 is provided whereby manual actuation of SW1 causes lamp L1 to be turned "on" through Q4 to allow for the testing of lamp indicator L1, thereby providing a "push-to-test" function.

Transient protection is further provided via MOV3 and zener diode Z4, with Z4 being connected across the output of lamp driver transistor Q4.

Diodes D3, D4 and D5 also act to provide isolation for the drive circuits of lamp driver Q4 and prevent any interaction between the timing circuits 10 and 20.

The operation of the circuit of FIG. 1 is as follows:

The output of each voltage comparator IC1 or IC2 at pin 6 will be "LOW" (approximately 0 volts) when the input voltage at pin 2 is higher than, or exceeds that of, the reference voltage appearing at pin 3.

When a "fully charged" battery supply source or battery tray is connected to each voltage sensor circuit "A" and "B" via terminals 11, 12 and 13, 14, respectively, the terminal voltage of each battery supply source is HIGH which causes the voltage comparator's output voltage, at pin 6, to go "LOW". Transistors Q1 and Q5 are turned "ON" thereby causing LEDs I1 and I2 to be energized and "lit" when the collector voltage of Q1 and Q5 rises to approximately 12 volts. LEDs I1 and I2 are supplied through R11 and R36, respectively.

At the same time, a positive voltage is applied to the right side of resistor networks R9, R10 and R34, R35. This positive signal voltage is then applied to pin 2 of voltage comparators IC1 and IC2. The level or value of this positive signal voltage is set and adjustable via variable resistors R10 and R35. Since a positive voltage previously existed at pin 2, this additional voltage, which enhances the input voltage at pin 2, represents positive feedback for the voltage comparators. The settings of R10 and R35 allow for the adjustment of the gain of the respective voltage comparators, i.e., the difference between the input voltages at which the voltage comparator will switch its output from "HIGH" to "LOW" and vice versa. Test jacks A and B are provided at the collectors of Q1 and Q5 respectively, thereby enabling a voltmeter to be utilized in the procedure of setting or adjusting R10 and R35 to the proper desired values.

As described above, when LEDs I1 and I2 are "lit", phototransistors T1 and T2 conduct. Phototransistors T1 and T2 are connected in series with each other and operate as an "AND gate" such that both phototransistors have to be turned "on" by their respective LEDs in order for transistor Q6 to be gated on, which thereby enables the 30-second timer circuit 20, and to inhibit the operation of the 5-minute timer circuit 10.

With both LEDs I1 and I2 "lit" and phototransistors T1 and T2 "conducting", the collector voltage of T2 approaches 0 volts and, accordingly, Q6 is gated "on". At the same time, a virtual short circuit is placed across C4, the timing capacitor for 5-minute timer device 10, which causes the 5-minute timer 10 to be held in the non-timing mode, i.e., "inhibit" operation.

Since Q6 is conducting, the 12 volt supply voltage is applied to the 30-second timer device 20 thereby activating the same. Timing capacitor C6 is then charged through R18 for a time period of approximately 30 seconds and when the C6 capacitor voltage reaches the same level as the voltage appearing at the junction of R21 and R22, PUT device Q7 fires thereby applying a pulse to the control gate of SCR device Q8 which is then turned "on".

Q4, the lamp driver transistor, previously had its base drive supplied through R23, D4 and D3 and had been supplying power to the output indicator lamp L1 since the "charged" battery supply sources were connected to the present device. When SCR device Q8 conducts, Q4 is starved of its base drive in that the voltage existing at the junction of R23 drops to a low voltage. Q8 is then "locked" in its conducting mode of operation and its anode current is supplied through R38. When this occurs, Q4 is turned "off" thereby causing lamp L1 to cease flashing.

The beforementioned operation of the 30-second timer and the related circuits including lamp driver L1 indicates to an operator of a mining vehicle that the vehicle is ready for use.

When either battery supply source discharges through the threshold voltage of its respective voltage comparator, the output of the voltage comparators at pin 6 switches or goes "HIGH" (approximately 12 volts). This beforementioned threshold voltage or "trip level" voltage will be further discussed hereinafter.

At the time when the voltage at the output of the respective voltage comparator goes "HIGH", Q1 or Q5 is turned "off", I1 or I2 turns "off" and the respective phototransistor is accordingly turned "off". Q6 then turns "off" and the short circuit previously appearing across C4, the timing capacitor of the 5-minute timer 10, is removed thereby allowing the 5-minute timer device to commence its operation. Timing capacitor C4 then begins to charge through R12 for a time period of approximately five minutes (full time-out period). If the output state of the respective voltage comparator continues to be "HIGH" during the before-mentioned five minute time-out period, thereby indicating that the battery supply source connected thereto continues to exhibit a "discharged" condition, the 5-minute timer 10 will then "time-out" and latch. The circuit operation and timing action of timer device 10 is similar to that of timer 20, as described above.

Accordingly, at the end of the five minute timing period of timer 10, when the C4 capacitor voltage reaches the same level as the voltage appearing at the junction of R13 and R14, PUT device Q2 fires and turns "on" SCR device Q3 which applies power (base drive) to the base of lamp driver transistor Q4 via R24, R37 and D3. The lamp begins flashing continuously and can only be extinguished or reset by the action of disconnecting the "discharged" battery supply source(s) from the mining vehicle and replacing them with "charged" sources. Thus, a "tamper-proof" feature is provided by the present battery discharge indicator circuit.

Since, in a battery powered mining vehicle, the current drawn by its traction motor is not constant, the terminal voltage of the battery supply source(s), therefore, will fluctuate depending upon the current or load drawn on the same and thereby causing supply voltage excursions. Accordingly, a condition will exist where the 5-minute timer circuit device will be reset (inhibited) prior to "time-out" as the voltage comparator output voltage state changes or switches consistent with the beforementioned battery supply voltage excursions.

When, however, the battery supply voltage no longer rises up through the threshold voltage, or "trip-level", of the respectively connected voltage comparator during the timing cycle or period of timer device 10, the 5-minute timer device 10 "times-out", latches and activates lamp driver Q4 which causes lamp L1 to be energized to render a continuously flashing indication.

As stated above, the battery discharge indicator circuit of the present invention provides a continuous flashing indication when either of the battery supply sources being monitored discharges through a pre-set "trip-level" for a predetermined time period. The present device also operates to provide a continuous flashing light indication whenever all or both of the battery supply sources, being monitored thereby and connected thereto, simultaneously discharge through a pre-set tip level and remain in such discharge state for a predetermined period of time.

The "trip-level" is the voltage level at which a discharged battery supply source causes the battery discharge circuit of the present device to render a continuously flashing indication thereby indicating that the battery supply source has discharged to a minimum charge level required to power a mining vehicle to a charging station. In that the distance between the location where a mining vehicle is being operated and the location of a charging station may vary, the present invention has been designed and may be preset or adjusted to accommodate the setting of various "trip-levels". This feature of the present device enables the distance between the location of the charging station and the location where the mining vehicle is being used to be programmed into the indicator circuit of the instant invention.

The setting of a desired "trip-level", predetermined discharge level, into the present indicator circuit is accomplished via adjustment of variable resistors R10 and R35 connected respectively in the positive feedback circuits of voltage comparators IC1, IC2. The trip-level is adjustable within the limits of ±25 pts. corresponding to a specific gravity range of a battery supply source, i.e., battery tray, of 1120 to 1170.

Factory adjustments provided in the instant invention preferably may set an "accept" voltage of 2.0 volts and a "discharge" voltage of 1.96 volts per cell of each battery tray being monitored and connected thereto. As mentioned previously, each of the battery trays being monitored normally contains 24 or 32 cells.

Accordingly, the battery discharge indicator circuit of the present invention may be programmed or pre-set with a predetermined "trip-level", via adjustment of R10 (voltage sensor "A") and R35 (voltage sensor "B"), such that when output indicator lamp L1 begins flashing continuously the mining vehicle may be driven for a period of time of, for example, approximately 15 minutes before the battery supply source(s) continue to discharge to the point at which the vehicle becomes disabled. This beforementioned predetermined "trip-level" corresponds to a battery supply source specific gravity of approximately 1150. Summarily, each voltage sensor circuit is programmed or pre-set to operate in accordance with a predetermined, desired "trip-level".

Many variations in the above described circuitry are possible without departing from the basic aspects of the instant invention. For example, if more than two battery supply sources are provided for powering a battery powered mining vehicle, a commensurate number of voltage sensor circuits and optical links need only be added thereto. Accordingly, each additional unit would be connected such that its corresponding phototransistor device is connected in series with the other phototransistors to form a similar "AND gate" device.

Furthermore, the present invention operates to automatically and separately interrogate or monitor each of a plurality of battery supply sources connected thereto whether the battery supply sources are connected in series or parallel.

As recited herein, many variations in the above-described circuitry of FIG. 1 are possible without departing from the basic aspects of the instant invention. These variations may be precipitated in accordance with the particular voltage rating of the battery supply system of an electrically powered mining vehicle to which the present invention is to be connected. For example, the present invention, as depicted in FIG. 1, may be used on electrically powered mining vehicles having battery supply systems which have higher voltage ratings than the previously mentioned 128 volt battery supply system.

Accordingly, in the case when the present invention, as depicted in FIG. 1, is used on an electrically powered mining vehicle having, for example, a 240 volt battery supply system, the inventors noted that considerable heat is generated by R25, located in lamp driver circuit 40, which is utilized as a series-connected dropping resistor for self-flashing lamp L1. Since the circuitry of the present invention is housed in a confined space and some of the circuit components are heat-sensitive, the considerable heat generated by R25, in this case, is considered to be undesirable.

The inventors have further noted that indicator lamps having various voltage ratings that match the battery supply source voltage of various types of electrically powered mining vehicles are readily available which, through the use thereof, would thereby eliminate the requirement for a series-connected dropping resistor. However, these readily purchased indicator lamps are not of the "self-flashing" type since they do not include a built-in flasher unit.

The present invention thus further provides an alternative indicator lamp driver circuit, shown in FIG. 2 and described hereinafter, which is used in place of the lamp driver circuit 40 of FIG. 1 when the present invention is used on electrically powered mining vehicles having battery supply systems which have higher voltage ratings than the previously mentioned 128 volt battery supply system.

Figure 2:
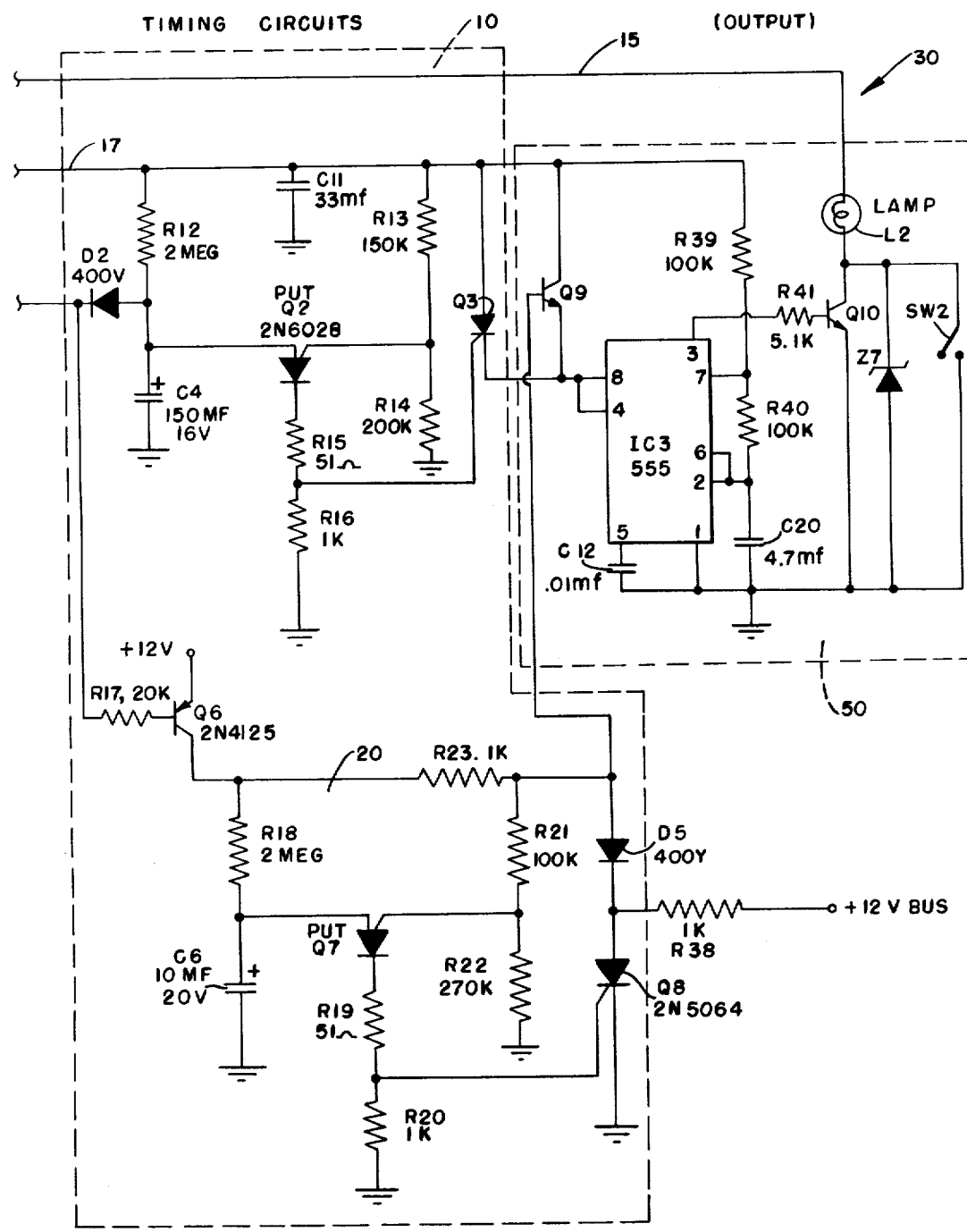
FIG. 2 shows a partial schematic circuit diagram of the battery discharge indicator circuit of FIG. 1 including an alternative indicator lamp driver circuit.

FIG. 2 is a partial schematic diagram of the battery discharge indicator circuit device of FIG. 1 including an alternative indicator lamp driver circuit 50. As shown therein, timing circuits 10 and 20 are essentially identical to that shown in FIG. 1 with the exception of components D4 and R37, which have been eliminated. Indicator lamp driver circuit 50 will now be described as follows.

Indicator lamp driver circuit 50 comprises: transistors Q9 and Q10; integrated circuit timer device IC3; resistors R39, R40 and R41; capacitors C12 and C20; zener diode Z7; push-button switch means SW2; and indicator lamp means L2.

Integrated circuit timer device IC3 comprises a "555 timer" configured as an astable oscillator. Since the "555 timer" and its internal components and operations are well-known, its operation in conjunction with the operation of lamp driver circuit 50 will only be described, for the sake of brevity.

Transistor Q9 is connected between circuit line 17 and pins 4 and 8 of IC3. The base of Q9 is connected to the junction of R23 and D5 of timing circuit 20 (30-second timer).

SCR device Q3 of timing circuit 10 (5-minute timer) has its anode connected to circuit line 17 and its cathode connected to the junction of the collector of Q9 and pins 4 and 8 of IC3.

Resistors R39, R40 and capacitor C20 are connected in series with each other and the collector of Q9 is connected to the top of resistor R39. The junction of R39 and R40 connects to pin 7 of IC3 and the junction of R40 and C20 (the timing capacitor for IC3) is connected to pins 2 and 6 of IC3.

The top of timing capacitor C20 is connected to the junction of pins 2 and 6 of IC3 and R40. The bottom of C20 connects to pin 1 of IC3 and ground.

Capacitor C12 is a high-frequency bypass applied to the IC3 control input to prevent erratic operation of IC3 and is connected between pins 1 and 5 of IC3.

Lamp driver transistor Q10 has its collector connected to lamp L2, which is connected in series with circuit line 15, and the emitter of Q10 is connected to ground. The base of Q10 is connected via resistor R41 to pin 3 of IC3.

Zener diode Z7, provided as a zener clamp to prevent damaging level voltage transients from reaching Q10, is connected across Q10.

A push-button switch means SW2 is connected across Z7 and Q10 and provides a "push-to-test" function whereby manual actuation of SW2 causes lamp L2 to be turned "on" to allow for testing of lamp L2. As shown in FIG. 2, the closing of switch SW2 causes a short circuit to be placed around Q10 for checking lamp operation.

The voltage rating of lamp L2 is preferably selected to match the battery supply source voltage of the electrically powered mining vehicle to which the battery discharge indicator device of the present invention is connected. Various lamps having different voltage ratings may be used in lamp driver circuit 50 depending upon the manner in which the present device is connected to the battery supply system of the mining vehicle.

Lamp driver circuit 50 utilized in conjunction with the present invention functions to cause lamp L2, a non-self-flashing lamp, to render either a continuously flashing indication when any of the voltage outputs of the battery supply sources reach a predetermined discharge level or to render a momentary flashing indication whenever "fully charged" battery supply sources are connected to the battery discharge indicator circuit of the present invention to replace the "discharged" battery supply sources.

The operation of lamp driver circuit 50 utilized in conjunction with the present invention will now be described as follows:

When "charged" battery supply sources are connected to the present invention, Q6 is turned "on", timer circuit 20 (30-second timer) commences its timing period of operation, and Q6 supplies base drive to Q9 which in turn applies 12 V to pin 8 of IC3. When the 12 V supply is applied to pin 8 of IC3, the astable oscillator will self-start. Base drive to Q10, the lamp driver, is then turned on and off by IC3 (555 timer) via its output pin 3 and L2 begins flashing. When timer circuit 20 (30-second timer) "times-out", Q8 is gated "on" and the base drive to Q9 is removed thereby turning "off" Q9 which removes the 12 V supply to pin 8 of IC3 and lamp L2 ceases flashing.

As stated above, the "555 timer" device IC3 is configured as an astable oscillator. Timing capacitor C20 charges through resistors R39 and R40 and discharges through pin 1 of IC3, pin 7 of IC3 and R40.

The timing capacitor voltage swings between one-third and two-thirds of the supply voltage on circuit line 17. The limits of the timing capacitors charge and discharge voltage (and hence the period of oscillation of IC3 which is slightly less than one-second) are set by an internal "discharge" transistor and an internal "trigger" device, not shown, which are contained in IC3. The internal "discharge" transistor is fired when the charge on C20 reaches two-thirds the supply voltage which completes a discharge path for C20 through IC3 from pin 1 to pin 7. The operation of the internal "discharge" transistor is controlled by the internal "trigger" device connected at pin 2 of IC3.

Accordingly, when the voltage charge level of C20 reaches two-thirds the supply voltage, timing capacitor C20 discharges as mentioned above and when the voltage charge level on C20 discharges to one-third the supply voltage, the internal "discharge" transistor is turned "off" by the internal "trigger" device and C20 then charges again through R39 and R40.

When any of the battery supply sources connected to the present device discharge through the threshold voltage of its respective voltage comparator and remain in such discharged state for a predetermined time period, timer circuit 10 (5-minute timer) operates to fire or turn "on" SCR device Q3 which supplies 12 V to pins 4 and 8 of IC3 which self-starts and causes lamp L2 to render a continuously flashing indication thereby alerting an operator of a battery powered mining vehicle to cease all work and return the vehicle to a charging station. Furthermore, Q3 can only be "unlatched" via the action of disconnecting the "discharged" battery supply source(s) from the mining vehicle and replacing them with "charged" sources, thereby providing a "non-tamperable" battery discharge indicator circuit device.

Lamp driver circuit 50 of FIG. 2 may also be used in conjunction with the present invention on electrically powered mining vehicles having battery supply systems with voltage ratings lower than 240 volts wherein an appropriate non-self-flashing indicator lamp (L2) having a voltage rating matching that of the battery supply system is selected and utilized therein.

Additionally, although the present invention has been described and illustrated in conjunction with its use on battery powered mining vehciles, the present device may also be used on various types of battery powered vehicles which are provided with a plurality of battery supply sources.

Although a preferred embodiment has been illustrated and described by way of example, it should be understood that the invention is not limited to the embodiment illustrated and many variations and modifications are possible within the scope of the invention without departing from the spirit of the invention. It is not intended to limit the invention except as defined in the following claims.

I claim:

1. A battery charge condition indicator circuit for a plurality of battery supply sources for an electrically powered mining vehicle, comprising:
    (a) circuit means for automatically and separately monitoring the charge condition of said plurality of battery supply sources, said circuit means having a first monitoring operation for determining when any of said plurality of battery supply sources discharge to a predetermined discharge level and a second monitoring operation for determining when said plurality of battery supply sources are charged to a predetermined charge level; and
    (b) indicating circuit means including means responsive to said first monitoring operation to provide a continuously flashing indication and further including means responsive to said second monitoring operation to provide a momentary flashing indication.

2. The battery charge condition indicator circuit as defined in claim 1 further including voltage sensor circuit means connected to each of said plurality of battery supply sources.

3. The battery charge condition indicator circuit as defined in claim 2 wherein each of said voltage sensor circuit means comprises an operational amplifier configured to be used as a voltage comparator.

4. The battery charge condition indicator circuit as defined in claim 2 further including optical link means connected to each of said voltage sensor circuit means thereby providing electrical isolation between each of said voltage sensor circuit means.

5. The battery charge condition indicator circuit as defined in claim 4 wherein each of said optical link means comprises a photo-optical coupler device comprising a light-emitting diode and a phototransistor.

6. The battery charge condition indicator circuit as defined in claim 4 wherein said indicator circuit means operates to provide the said continuously flashing indication whenever each of said plurality of battery supply sources discharge to a predetermined discharge level and remain in such discharge condition for a predetermined time period.

7. The battery charge condition indicator circuit as defined in claim 6 further including timer means connected between said optical link means and said indicator circuit means which timer means determines the said predetermined time period.

8. The battery charge condition indicator circuit as defined in claim 7 wherein the operation of said timer means is controlled via said optical link means.

9. The battery charge condition indicator circuit as defined in claim 8 further including second timer means connected between said optical link means and said indicator circuit means wherein said second timer means operates to cause said indicator circuit means to provide the said momentary flashing indication.

10. The battery charge condition indicator circuit as defined in claim 9 wherein the operation of said second timer means is also controlled via said optical link means.

11. The battery charge condition indicator circuit as defined in claim 1 wherein said indicating circuit means provides the said continuously flashing indication to alert an operator of said electrically powered mining vehicle to return the vehicle to a charging station, and provides the said momentary flashing indication to alert an operator that fully charged battery supply sources are connected to the vehicle and said vehicle is ready for use.

12. The battery charge condition indicator circuit as defined in claim 1 wherein said circuit means further includes means for programming the said first monitoring operation to operate in accordance with a preset, predetermined discharge level, thereby enabling the distance between the location of said electrically powered mining vehicle and the location of a charging station to be programmed into said battery charge condition indicator circuit.

13. The battery charge condition indicator circuit as defined in claim 1 wherein said indicator circuit means includes a lamp driver means and a self-flashing indicator lamp means.

14. The battery charge condition indicator circuit as defined in claim 1 wherein said indicator circuit means includes a lamp driver means and a non-self-flashing indicator lamp means.

15. The battery charge condition indicator circuit as defined in claim 14 wherein said lamp driver means includes as astable oscillator means.

16. The battery charge condition indicator circuit as defined in claim 15 wherein said astable oscillator means comprises an integrated circuit timer means.

17. A battery discharge indicator circuit for monitoring the discharge condition of a plurality of battery supply sources for an electrically powered mining vehicle, comprising:
    (a) means for automatically and separately monitoring the discharge condition of each of said plurality of battery supply sources for an electrically powered mining vehicle;
    (b) means for indicating when each of said plurality of battery supply sources discharge to a predetermined discharge level and remain in such discharge condition for a predetermined time period;
    (c) voltage sensor circuit means connected to each of said plurality of battery supply sources;
    (d) each of said voltage sensor circuit means comprising an operational amplifier configured to be used as a voltage comparator;
    (e) optical link means connected to each of said voltage sensor circuit means thereby providing electrical isolation between each of said voltage sensor circuit means;

(f) indicator circuit means actuated to provide a continuously flashing indication whenever each of said plurality of battery supply sources discharge to a predetermined discharge level and remain in such discharge condition for a predetermined time period; and (g) timer means connected between said optical link means and said indicator circuit means which timer means determines the said predetermined time period.

18. The battery discharge indicator circuit as defined in claim 17 wherein the operation of said timer means is controlled via said optical link means.

* * * * *